US006289486B1

(12) United States Patent
Lee et al.

(10) Patent No.: US 6,289,486 B1
(45) Date of Patent: Sep. 11, 2001

(54) ADAPTIVE CHANNEL ENCODING METHOD AND DEVICE

(75) Inventors: Pil Joong Lee; Young Kim; Chang Soo Park, all of Seoul; Hyeon Woo Lee, Suwon-shi; Jun Jin Kong, Songnam-shi, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/126,250

(22) Filed: Jul. 30, 1998

(30) Foreign Application Priority Data

Jul. 30, 1997 (KR) ................................. 97-36365
Nov. 10, 1997 (KR) ................................. 97-60101

(51) Int. Cl.$^7$ ............................................. H03M 13/00
(52) U.S. Cl. ........................................ 714/788; 714/701
(58) Field of Search ..................... 714/788, 787, 714/790, 792, 755, 786, 701; 375/265

(56) References Cited

U.S. PATENT DOCUMENTS

| 4,519,068 | 5/1985 | Krebs et al. ............................ 370/324 |
| 4,559,625 | 12/1985 | Berlekamp et al. ..................... 714/701 |
| 5,056,105 | 10/1991 | Darmon et al. ......................... 375/130 |
| 5,446,747 | 8/1995 | Berrou ................................... 714/788 |
| 5,602,836 | 2/1997 | Papadooulos et al. .................. 370/280 |
| 5,721,745 | 2/1998 | Hladik et al. ............................ 714/755 |
| 5,745,497 | 4/1998 | Ben-Efraim et al. .................... 714/702 |
| 5,996,104 | * 11/1999 | Herzberg .............................. 714/755 |
| 6,023,783 | * 2/2000 | Divsalar et al. ......................... 741/792 |

OTHER PUBLICATIONS

Benedetto et al., Iterative decoding of serially concatenated convolutional codes, IEEE, p. 1186–1188, Jun. 1996.*
Reed et al. Turbo–Code Termination Scheme and a Novel Alternative for Short Frames, IEEE, p. 354–358, May 1996.*
Benedetto et al. Unveiling Turbo Codes: Some Results on Parallel concatenated Coding Schemes, IEEE, p. 409–428, Mar. 1996.*
Berrou et al. Near Optimum Error Correcting Coding and Decoding: Turbo Codes, IEEE, p. 1261–1271, Oct. 1996.*
Barbulescu et al. Interleaver design for turbo codes, IEEE, p. 2107–2108, Dec. 1994.*
Blackert et al., Turbo code termination and interleaver conditions, IEEE, p. 2082–2084, Nov. 1995.*
Berrou et al., NEar Shannon Limit Error–Correcting Coding and Decoding: Turbo Codes (1), IEEE, p. 1064–1070, Mar. 1993.*
Yi et al., Interleaving and Decoding Scheme for a product Code for a Mobile Data Communication, IEEE, p. 144–147, Feb. 1999.*
Hagenauer, J., *Iterative decoding of binary block and convolutional codes*, IEEE, vol. 42, No. 2, Mar. 1996, pp. 429–445.
Joeressen, O., et al., *Soft–Output viterbi decoding: VLSI implementation issues*, IEEE, 1993, pp. 941–944.
Robertson, P., et al., *A comparison of optimal and sub–optimal MAP decoding algorithms operating in the log domain*, IEEE, 1995, pp. 1009–1013.

* cited by examiner

Primary Examiner—Albert Decady
Assistant Examiner—Shelly A Chase
(74) Attorney, Agent, or Firm—Dilworth & Barrese, LLP

(57) ABSTRACT

There is provided a channel encoder having convolutional encoders concatenated in parallel or in series. The channel encoder includes a first encoder for encoding input information bits, an interleaver having a memory and an index generator, for modifying the order of the information bits in a predetermined method, a second encoder for encoding the output of the interleaver, first and second terminating devices for terminating frames of input and output information bits of the first and second encoders, a tail bit generator for storing tails bits used in frame termination, and a controller and a switch for controlling the above procedure.

82 Claims, 11 Drawing Sheets

ADAPTIVE CHANNEL ENCODING METHOD AND DEVICE

BACKGROUND OF THE INVENTION

1. Field of the Invention

The present invention relates to adaptive channel encoding methods and devices for communications systems, and in particular, to adaptive channel encoding methods and devices for use in transmission of voice and data.

2. Description of the Related Art

A turbo encoder, constituted in a parallel or serial structure, generates parity symbols from an input N-information bit frame with two simple component (or constituent) encoders. It uses a recursive systematic convolutional (RSC) code as a component (or constituent) code.

FIG. 1 is a block diagram of a conventional parallel turbo encoder, disclosed in U.S. Pat. No. 5,446,747 by Berrou. In the turbo encoder of FIG. 1, an interleaver 12 is interposed between first and second component encoders 11 and 13. The interleaver 12 has a size equivalent to the frame length N of the input information bits, and modifies the sequence of information bits received in the second component encoder 13 to reduce correlation between information bits. FIG. 2 is a block diagram of a conventional serial turbo encoder also having the interleaver 12 connected between the first and second component encoders 11 and 13.

The above turbo encoders produce a turbo code for use in space communications. Though a constraint length K in the component encoders 11 and 13 is shorter than that of a conventional convolutional code (i.e., K=9), the interleaver 12 uses a very large memory, resulting in a very long delay at decoding.

FIG. 3 is a block diagram of a turbo decoder for decoding the output of the parallel turbo encoder shown in FIG. 1, also disclosed in U.S. Pat. No. 5,446,747 by Berrou. FIG. 4 is a block diagram of a turbo decoder for decoding the output of the serial turbo encoder shown in FIG. 2, proposed by Benedetto in an article of IEEE Electronics Letters, Vol. 32, No. 13, June 1996.

The parallel turbo decoder of FIG. 3 advantageously enhances performance characteristics in terms of bit error rate (BER) by repeatedly decoding input data in frame units, using an iterative decoding algorithm. An interleaver 323 contributes to an increase in an error correction capability by distributing burst error patterns which were not corrected by a first decoder 319, prior to correction of the burst error patterns in a second decoder 327.

The iterative decoding refers to repeated decoding of symbols which were decoded in a specific procedure, using resulting extrinsic information, to achieve excellent decoding performance. Iterative decoding algorithms are SOVA (Soft-Output Viterbi Algorithm: see Proceedings of IEEE Vehicular Technology Conference, pp. 941–944, May 1993) and MAP (Maximum Aposteriori Probability: see IEEE Transactions on Information Theory, pp. 429–445, Vol. 42, No. 2, March 1996). SOVA is a modification of a Viterbi algorithm which produces a soft decision output and can minimize codeword error rate. On the other hand, MAP can minimize symbol error rate.

In the decoder of FIG. 3, outputs $y_{1k}$ and $y_{2k}$ of a depuncturer 313 are $y_k$ and zero, respectively, when a parity symbol $y_k$ is received from the first component encoder 11 of FIG. 1, whereas they are zero and $y_k$, respectively, when the parity symbol $y_k$ is received from the second component encoder 13 of FIG. 1. $Z_{k+1}$ is a soft decision symbol used as extrinsic information in an iterative decoding algorithm and an input for decoding in a next stage. Data elements ($\check{D}$) obtained by subjecting the $Z_{k+1}$ of the final decoding stage to hard decision are taken into account at output of the last module as intended. The performance of the turbo code depends on interleaver size, interleaver structure, and the number of iterative decodings.

As shown in FIG. 1, the turbo encoder includes the interleaver 12. The interleaver 12 causes turbo encoding/decoding to be implemented in frame units. Thus, the complexity of turbo code is proportional to the product of frame size of a memory necessary for first and second iterative decoders 319 and 327 shown in FIG. 3 and the state number of component codes for the first and second component encoders 11 and 13. The turbo code cannot find its application in voice and data transmission due to use of very large frames. Increasing the state number of the component codes for the turbo encoder in order to achieve better performance leads to increased complexity of the first and second component encoders 11 and 13.

With a burst error in the decoder as shown in FIG. 3, the output of the first iterative decoder 319 has a correlation, which impedes reliable decoding in the second iterative decoder 327 in the next decoding stage. Hence, errors are incurred in a whole block and cannot be corrected in a next iterative decoding stage. In this context, there is an ever increasing need for an interleaver and a deinterleaver which can distribute burst errors in a single frame of a code subject to iterative decoding without correlation.

Due to the advantage of low correlation, a random interleaver increases the performance of the turbo code. With small frame size, however, the random interleaver has limitations in its effectiveness for distributing burst errors without correlation and requires a look-up table. Hence, voice transmission or low-rate data transmission require small frame size and a small number of component code states to minimize delay time. Voice transmission or low-rate data transmission further need a structured interleaver. In short, the conventional turbo code is not viable in the voice and data transmission because of the unacceptability of the constraint length of the component codes and the large interleaver. Nevertheless, efforts are increasingly expended on realization of an encoder and a decoder for a communications system, taking the advantages of the conventional turbo code into account.

Therefore, a need exists for a turbo encoder having a performance equal to or higher than that of a convolutional encoder in a conventional communications system. A further need exists for an interleaver having excellent performance with small component code states and minimized delay time. Though the performance of the interleaver 12 of FIG. 1 or 2 for use in a turbo encoder is generally proportional to the interleaver size, the frame size of the turbo code is limited. In this case, it is preferable to use an interleaver that maximizes a minimum hamming distance of the turbo code in terms of a block code. A structured interleaver can be employed for small frames.

SUMMARY OF THE INVENTION

Therefore, an object of the present invention is to provide turbo encoding method and device, which can encode voice and low transmission rate-data in a communications system.

Another object of the present invention is to provide a parallel or serial turbo encoding method and device, in which a diagonal interleaver is used to interleave input data regardless of frame size in a communications system.

A further object of the present invention is to provide a parallel or serial turbo encoding method and device, in which a circular shifting interleaver is used to interleave input data regardless of frame size in a communications system.

Still another object of the present invention is to provide a method and device for transmitting tail bits and parity bits generated from the tail bits on a channel in a device for encoding voice and data signals to a turbo code.

Yet another object of the present invention is to provide a method and device for adjusting a data transmission rate by puncturing data and parity information in a device for encoding voice and data signals to a turbo code.

To achieve the above objects, there is provided a turbo encoder. The turbo encoder includes a plurality of component encoders for encoding input information bits, and a diagonal interleaver connected to an input port of one of the component encoders and having a table for storing column and row information corresponding to a variable frame size, for determining column and row information corresponding to the frame size of the input information bits and diagonally interleaving the information bits.

According to another aspect of the present invention, there is provided a turbo encoder. The turbo encoder includes a plurality of component encoders for encoding input information bits, and a circular shifting interleaver connected to an input port of one of the component encoders and having a table for storing hop and step information corresponding to a variable frame size, for determining hop and step information corresponding to the frame size of the input information bits and performing a circular shifting interleaving on the information bits.

According to still another aspect of the present invention, there is provided a turbo encoder. The turbo encoder includes a plurality of component encoders for encoding input information bits, an interleaver connected to an input port of one of the component encoders, for interleaving the information bits according to a frame size, and as many tail bit generators as the component encoders for terminating a frame, analysing the values of memory devices in the component encoders, and generating tail bits to terminate the frame of the input data.

According to a further aspect of the present invention, there is provided a turbo encoder. In the turbo encoder, a plurality of component encoders encode input information bits. An interleaver is connected to an input port of one of the component encoders, for interleaving the information bits according to a frame size. As many tail bit generators as the component encoders block information bits from being input to the component encoders for terminating a frame, analyse the values of memory devices in the component encoders, and generate tail bits to terminate the frame of the input data. A first puncturer punctures the input information bits at a predetermined rate. A second puncturer punctures the outputs of the component encoders at a predetermined rate to adjust a transmission rate of the encoded data.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
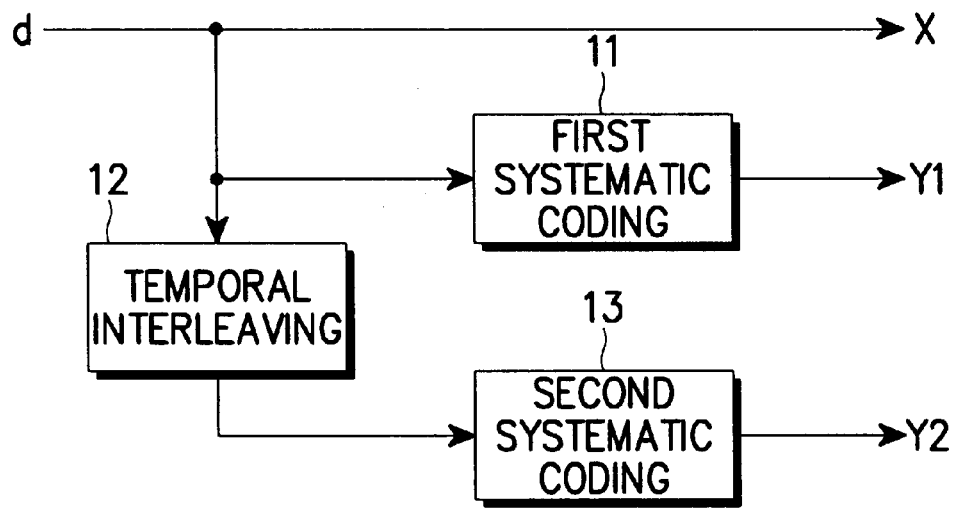
FIG. 1 is a block diagram of a conventional parallel concatenated recursive systematic encoder.
Figure 2:
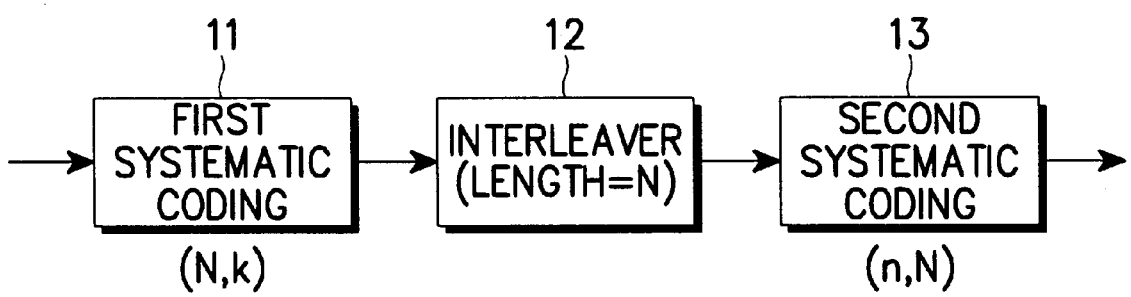
FIG. 2 is a block diagram of a conventional serial concatenated recursive systematic encoder.
Figure 3:
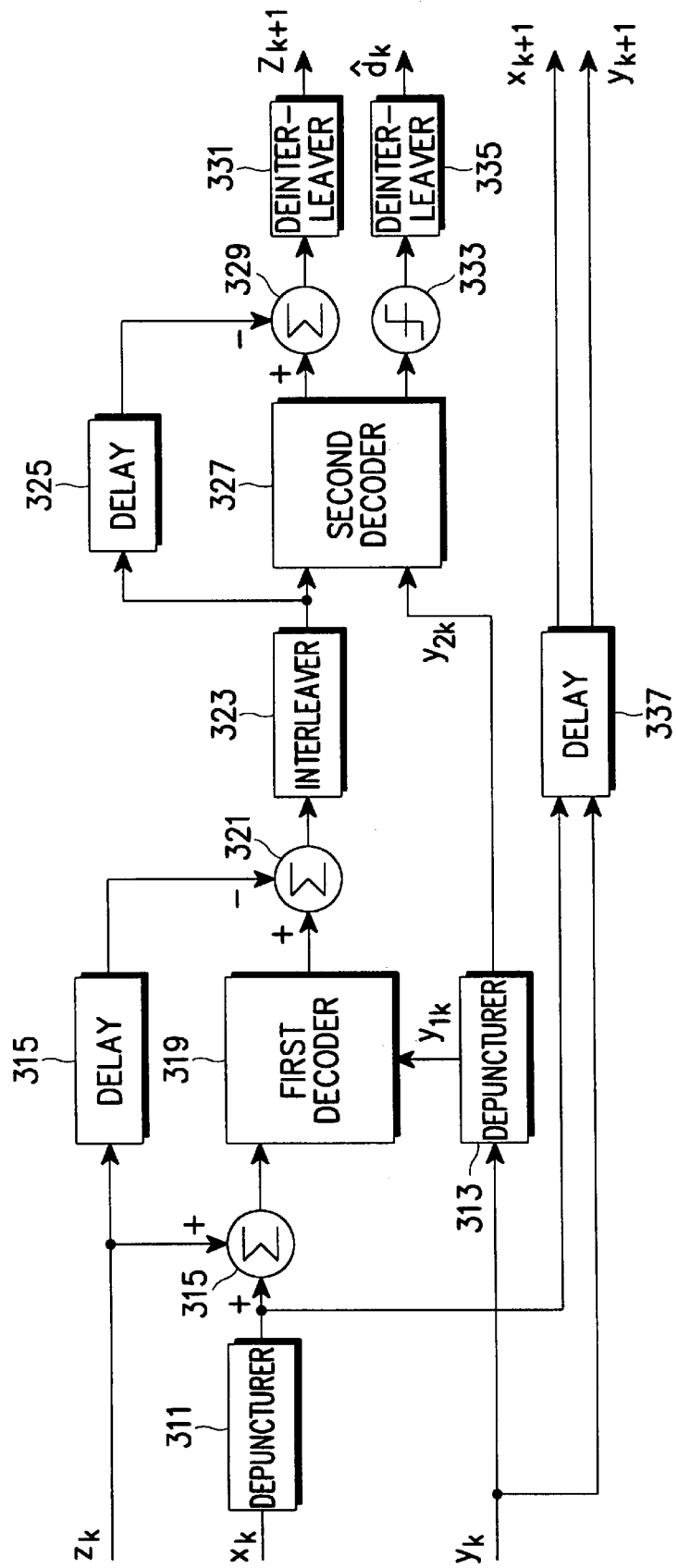
FIG. 3 is a block diagram of a conventional parallel concatenated recursive systematic decoder.
Figure 4:
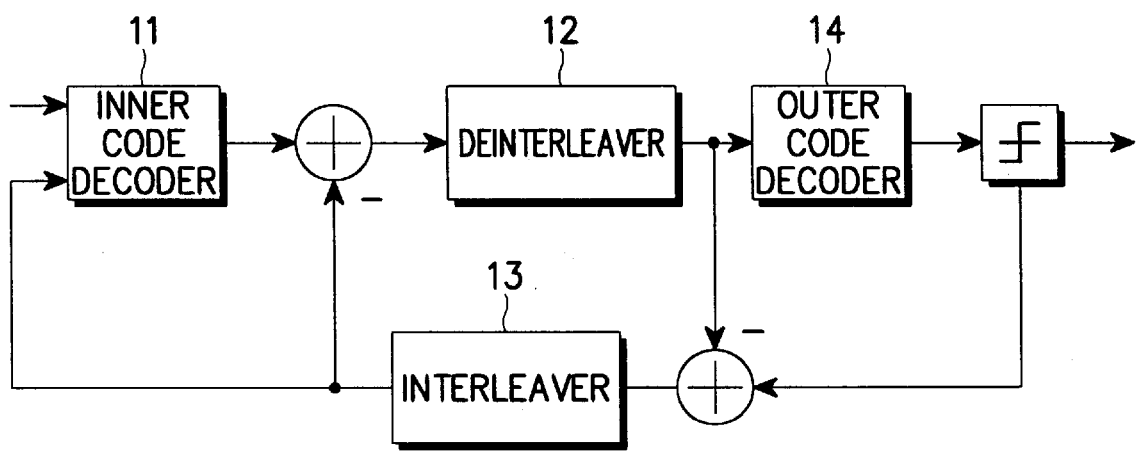
FIG. 4 is a block diagram of a conventional serial concatenated recursive systematic decoder.
Figure 5:
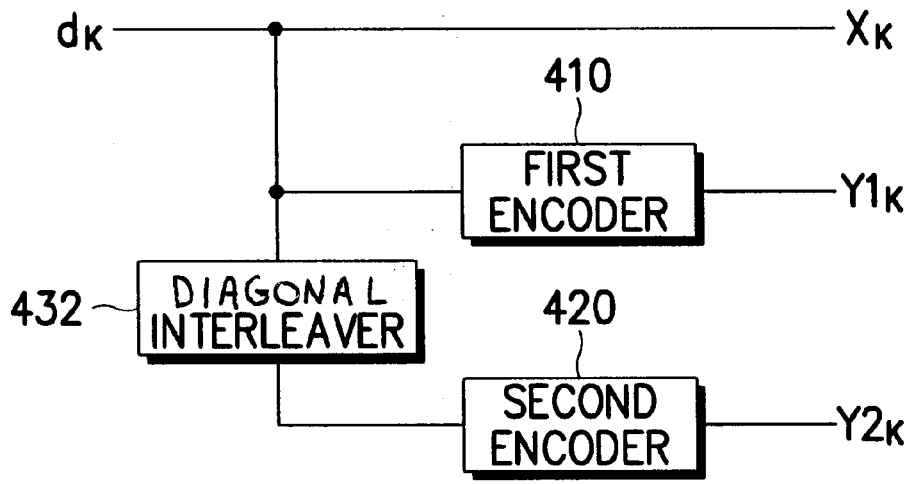
FIG. 5 is a block diagram of a concatenated recursive systematic encoder according to a first embodiment of the present invention.
Figure 6:
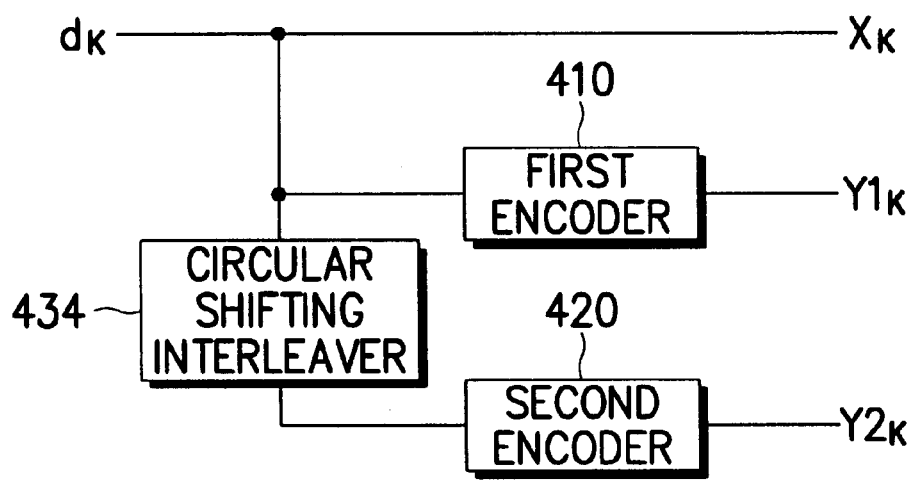
FIG. 6 is a block diagram of a concatenated recursive systematic encoder according to a second embodiment of the present invention.

For clarity of description, the embodiments of the present invention are described with reference to a parallel concatenated recursive turbo encoder, other configurations are contemplated such as a serial recursive turbo encoder. FIGS. 5 and 6 are block diagrams of turbo encoders according to the embodiments of the present invention. Encoders 410 and 420 are component encoders for encoding an input information bit $d_k$ to a parity symbol $V_k$ similar to the component encoders of FIGS. 1 and 2. An diagonal interleaver 432 and a circular shifting interleaver 434 are a feature of the present invention and will be called an interleaver 430 unless a specific one is referred to.

Referring to FIGS. 5 and 6, information bits $d_k$ are simultaneously fed to the first component encoder 410 and the interleaver 430. The interleaver 430 modifies the order in which the information bits are arranged and, preferably, maximizes a minimum Hamming distance of an encoded output sequence ($X_k$, $Y_k$) corresponding to the information bits $d_k$. A data frame input to the channel encoder is variable in length because a CRC (Cyclic Redundancy Check) bit and other control bits are added to data. To forcedly fix the data frame length, dummy bits should be added depending on the difference between frame size and interleaver size. But, since these dummy bits have nothing to do with improvement of system performance, it is desirable to reduce them. Thus, the interleaver 430 provides excellent performance and reliable operation regardless of a variation in frame size-associated parameters.

Figure 7:
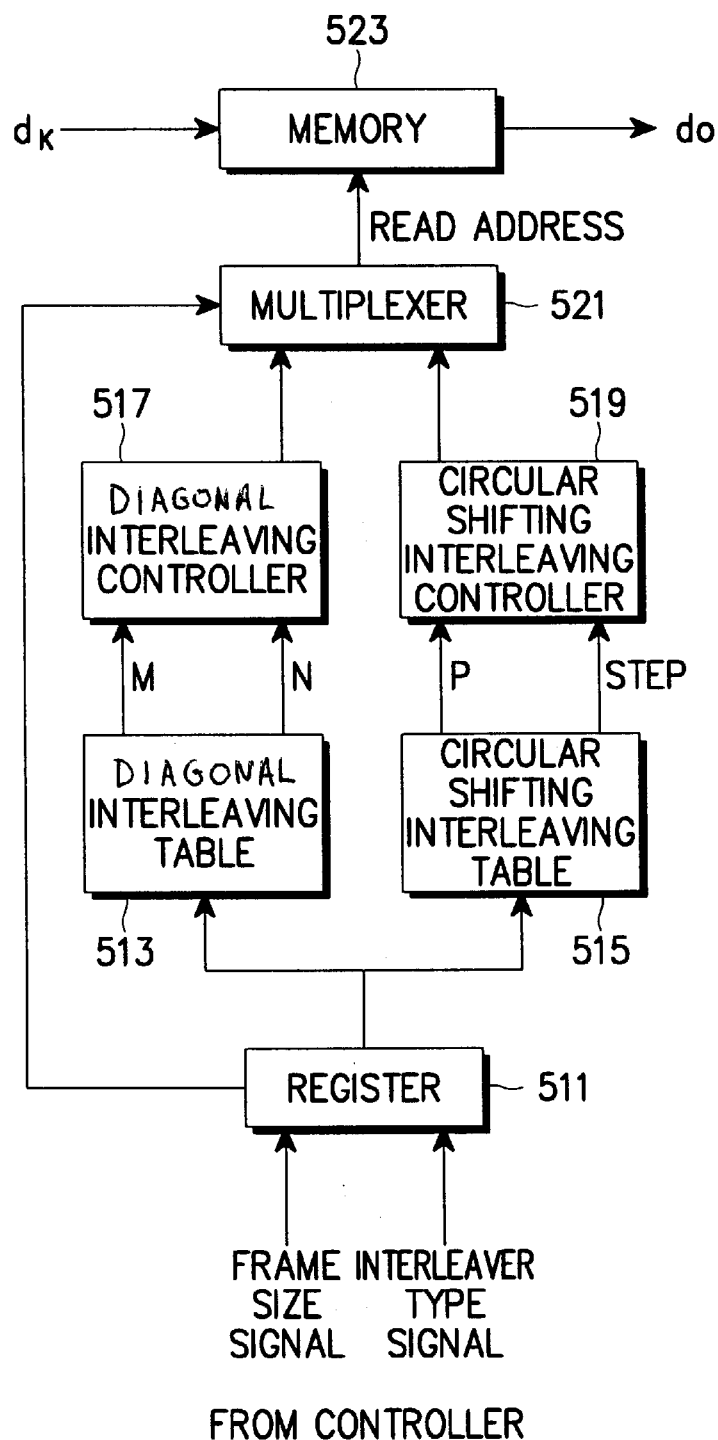
FIG. 7 is a block diagram of a diagonal interleaver and a circular shifting interleaver in the turbo encoder according to the first embodiment of the present invention.

FIG. 7 is a block diagram of the diagonal interleaver 432 and the circular shifting interleaver 434 shown in FIGS. 5 and 6, respectively. Both the diagonal and circular shifting interleavers 432 and 434 analyse their corresponding variable frame sizes upon receipt of information bits and perform an optimum interleaving on the input information bits by interleaver related parameters received from a system controller according to the frame size analysis results. The diagonal interleaver 432 and the circular shifting interleaver 434 are combined into one in description of the embodiments of the present invention, however, a turbo encoder may specifically employ either diagonal interleaving or circular shifting interleaving, separately. Hereinbelow, the diagonal interleaver 432 and the circular shifting interleaver 434 are referred to as the interleaver 430.

Referring to FIG. 7, a register 511 stores a frame size signal and an interleaver type signal received from a system controller (not shown). A diagonal interleaving table 513 stores the numbers M and N of columns and rows in a matrix allowing optimum diagonal interleaving characteristics with respect to frame size during diagonal interleaving. That is, it stores measured M×N values which enable optimum diagonal interleaving of information bits with a variable frame size. The diagonal interleaving table 513 outputs an M×N value corresponding to the frame size signal received from the register 511. A diagonal interleaving controller 517 receives the M×N value from the diagonal interleaving table 513 and generates a read address for interleaving the information bits in a designated interleaving method.

A circular shifting interleaving table 515 stores hop parameters P and step parameters STEP allowing optimum circular shifting interleaving characteristics with respect to the frame size of the information bits in the case of circular shift interleaving. The hop parameters P and the step parameters STEP are empirically measured. The circular shifting interleaving table 513 outputs parameters P and STEP corresponding to the frame size signal received from the register 511. A circular shifting interleaving controller 519 receives the parameters P and STEP from the circular shifting interleaving table 515 and generates a read address for interleaving the information bits in a designated circular shifting interleaving method. A multiplexer 521 receives the read addresses from the diagonal interleaving controller 517 and the circular shifting interleaving controller 519 and selects one of them in accordance with the interleaver type signal received from the register 511. A memory 523 receives the information bits sequentially and outputs the information bits stored at the read address received from the multiplexer 521 in an interleaved order. The memory 523 is designed to be large enough to accommodate information bits with a maximum variable frame size.

For a structure with only the diagonal interleaver 432 in FIG. 7, the register 511, the diagonal interleaving table 513, the diagonal interleaving controller 517, and the memory 523 are included. On the other hand, for a structure with only the circular shifting interleaver 434 in FIG. 7, the register 511, the circular shifting interleaving table 515, the circular shifting interleaving controller 519, and the memory 523 are included. Both the cases do not need the multiplexer 521 and the interleaver type signal if only one type of interleaving is employed.

The diagonal interleaving table 513 and the circular shifting interleaving table 515 may be composed of a memory like a ROM or a RAM, or logical devices in combination. The diagonal interleaving controller 517 and the circular shifting interleaving controller 519 can be realized, using logical devices in combination or a digital signal processor.

Figure 8:
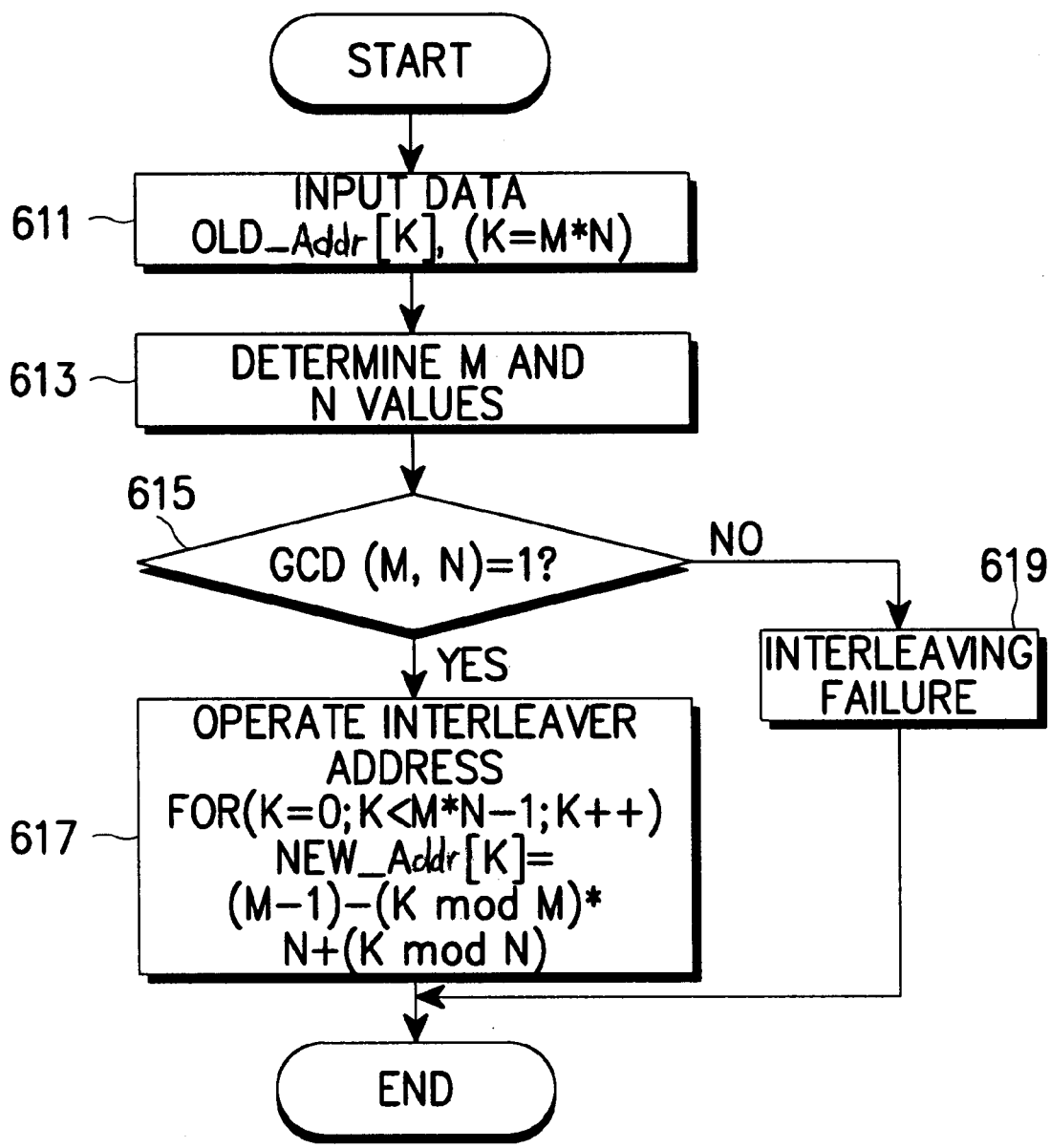
FIG. 8 is a flow chart showing a first diagonal interleaving operation in the diagonal interleaver of FIG. 7.
Figure 9:
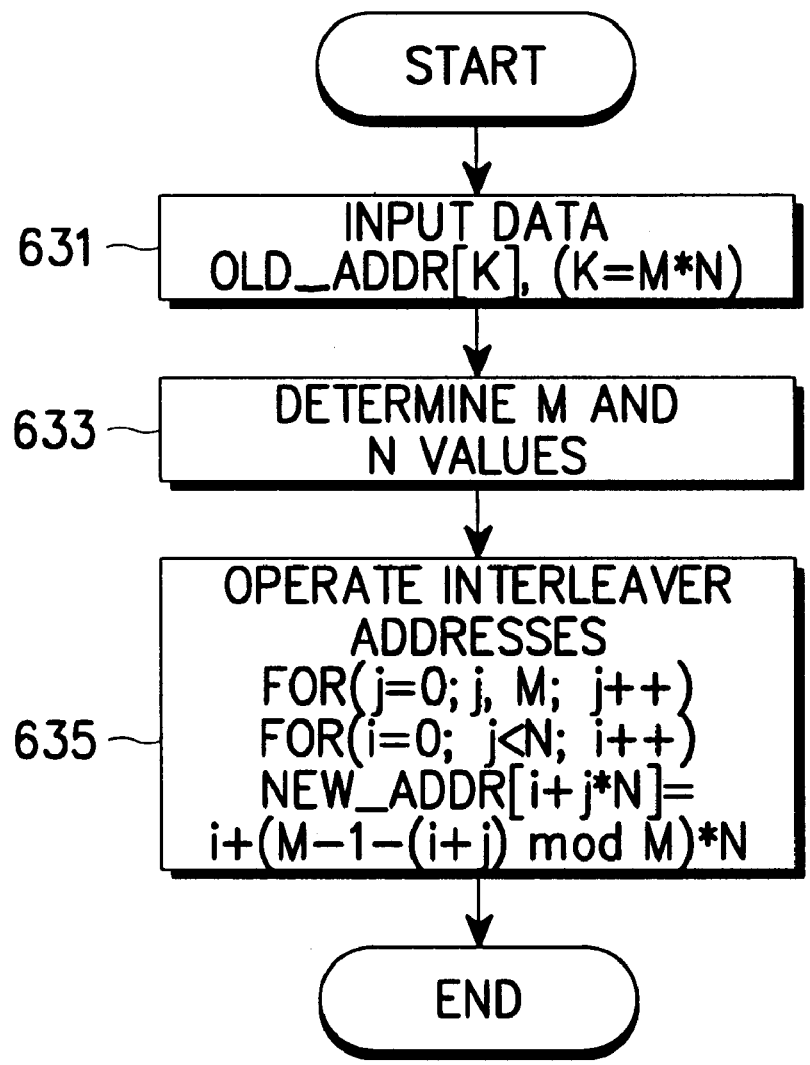
FIG. 9 is a flow chart showing a second diagonal interleaving operation in the interleaver of FIG. 7.
Figure 10:
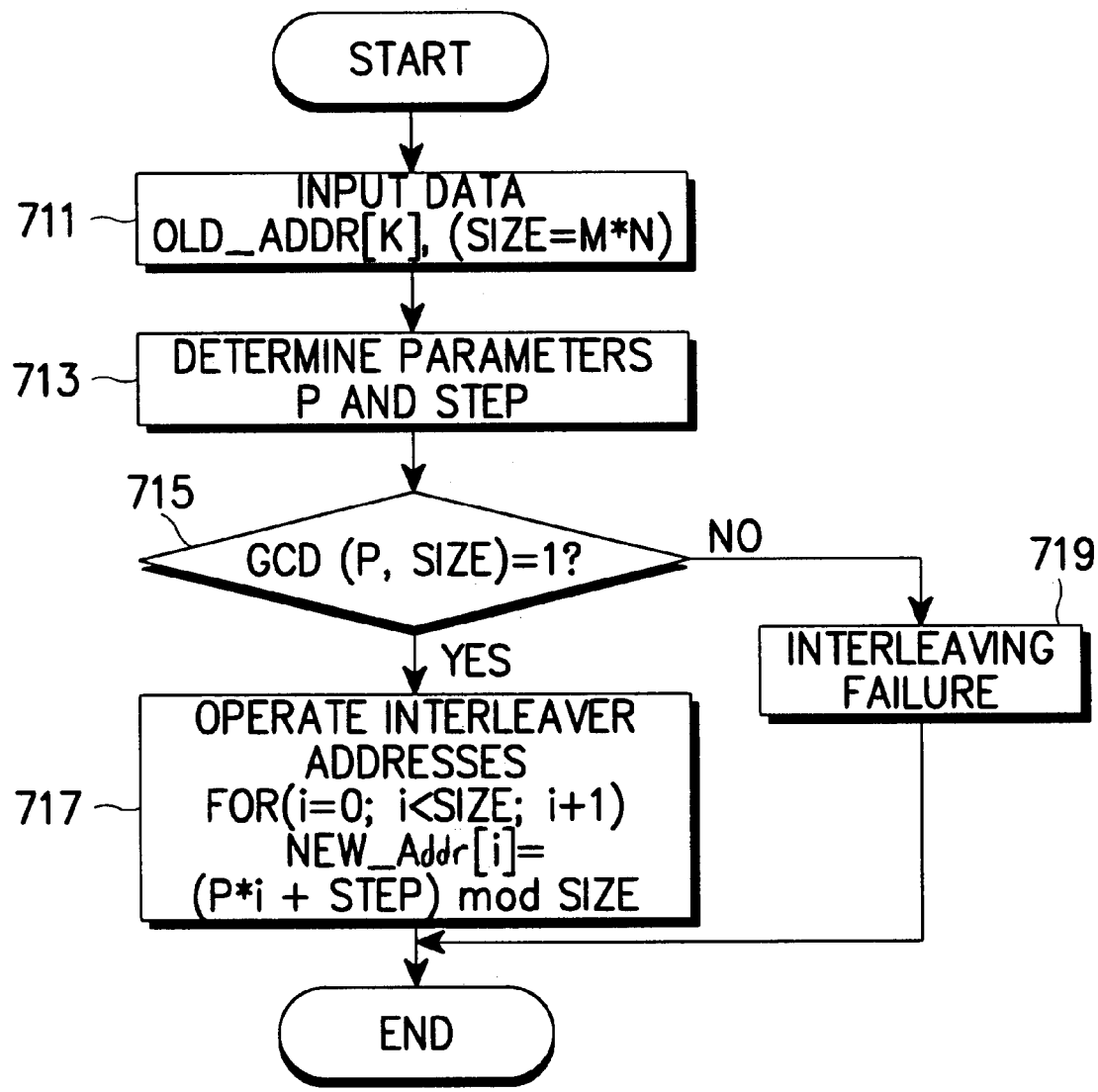
FIG. 10 is a flow chart showing a first circular shifting interleaving operation in the interleaver shown in FIG. 7 according to a second embodiment of the present invention.
Figure 11:
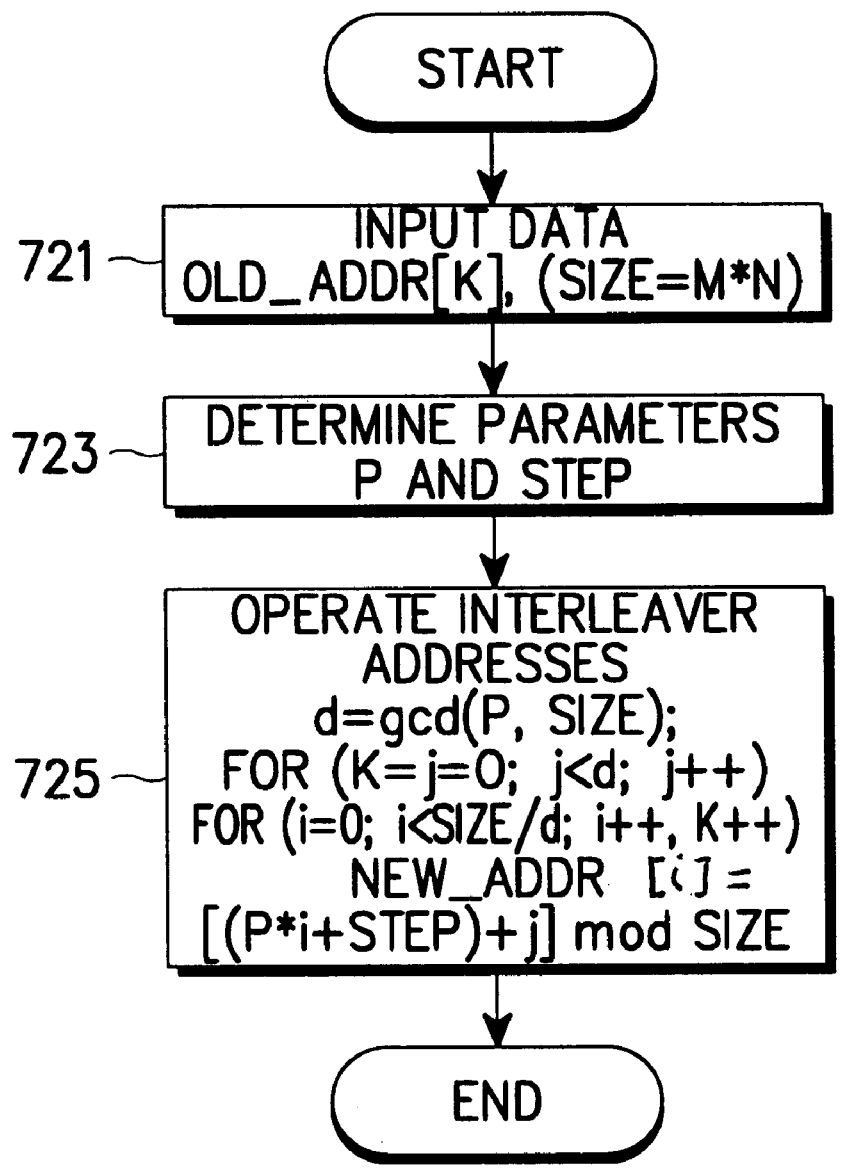
FIG. 11 is a flow chart showing a second circular shifting interleaving operation in the interleave shown in FIG. 7.

FIGS. 8 and 9 are flowcharts of exemplary diagonal interleavings, and FIGS. 10 and 11 are flowcharts of exemplary circular shifting interleavings. An interleaver which shall be described below, by way of example, has an input buffer.

Referring to the structure of the interleaver 430 shown in FIG. 7, first to third diagonal interleaving operations will be described hereinbelow.

FIG. 8 is a flowchart of the first diagonal interleaving operation. In FIG. 8, the first diagonal interleaving includes a process of reordering an input bit sequence in an M×N matrix. For the first diagonal interleaving, upon receipt of information bits $d_k$, the information bits are stored at addresses old_addr[k] for sequentially storing the information bits in the memory 523 (FIG. 7) and the data frame size k is determined, in step 611. Then, the column and row parameters M×N of the data frame for diagonal interleaving is determined in step 613. That is, to implement diagonal interleaving, the M×N value is designated from the diagonal interleaving table on the basis of the input frame data size k. A plurality of M×N values may be stored in a look-up table to be selected according to the input frame size k. Alternatively, an optimum M×N may be calculated according to the input frame size k. In step 615, it is determined whether the greatest common divisor (GCD) of M and N is 1. When the GCD of M and N is 1, first diagonal interleaving addresses are operated as follows, in step 617.

$$\text{for } (k=0; k<M*N-1; k++) \text{ new addr}[k]=(M-1-(k \bmod N))*N+(k \bmod N) \quad (1)$$

Following the designation of the addresses in an output buffer as in equation (1), the input information bits stored in the input buffer are interleaved and stored in the output buffer.

If the GCD of M and N is not 1, that is, [GCD (M, N)≠1] in step 615, it is determined that the interleaving fails in step 619 and the procedure is terminated.

In the first diagonal interleaving, assuming that a data sequence with M=6 and N=5 stored in old_addr[k] is {0 1 2 3 4 5 6 7 8 9 10 11 12 13 14 15 16 17 18 19 20 21 22 23 24 25 26 27 28 29}, a first diagonal interleaver output sequence stored in new_addr[k] of the output buffer is {25 21 17 13 9 0 26 22 18 14 5 1 27 23 19 10 6 2 28 24 15 11 7 3 29 20 16 12 8 4}.

The input data and the first diagonal interleaver output are tabulated in M×N matrixes as follows.

TABLE 1

| input sequence (M = 6, N = 5) | | | | | interleaved sequence (M = 6, N = 5) | | | | |
|---|---|---|---|---|---|---|---|---|---|
| 0 | 1 | 2 | 3 | 4 | 25 | 21 | 17 | 13 | 9 |
| 5 | 6 | 7 | 8 | 9 | 0 | 26 | 22 | 18 | 14 |
| 10 | 11 | 12 | 13 | 14 | 5 | 1 | 27 | 23 | 19 |
| 15 | 16 | 17 | 18 | 19 | 10 | 6 | 2 | 28 | 24 |
| 20 | 21 | 22 | 23 | 24 | 15 | 11 | 7 | 3 | 29 |
| 25 | 26 | 27 | 28 | 29 | 20 | 16 | 12 | 8 | 4 |

However, the above first diagonal interleaving is viable only when the GCD of M and N is 1. When the GCD (M, N)≠1, for example, M=6 and N=6, the first diagonal interleaving is impossible and the same data is overwritten as shown in table 2.

TABLE 2

| input sequence (M = 6, N = 6) | | | | | | interleaved sequence (M = 6, N = 6) | | | | | |
|---|---|---|---|---|---|---|---|---|---|---|---|
| 0 | 1 | 2 | 3 | 4 | 5 | 30 | 25 | 20 | 15 | 10 | 5 |
| 6 | 7 | 8 | 9 | 10 | 11 | 30 | 25 | 20 | 15 | 10 | 5 |
| 12 | 13 | 14 | 15 | 16 | 17 | 30 | 25 | 20 | 15 | 10 | 5 |
| 18 | 19 | 20 | 21 | 22 | 23 | 30 | 25 | 20 | 15 | 10 | 5 |
| 24 | 25 | 26 | 27 | 28 | 29 | 30 | 25 | 20 | 15 | 10 | 5 |
| 30 | 31 | 32 | 33 | 34 | 35 | 30 | 25 | 20 | 15 | 10 | 5 |

Second and third diagonal interleavings include a process for permuting an input information bit sequence expressed in an M×N matrix and enable input data to be interleaved regardless of the GCD (M, N)=1 or ≠1.

FIG. 9 is a flowchart of the second diagonal interleaving operation. Referring to FIG. 9, the second diagonal interleaving reorders input bits in an M×N matrix and is applicable to both of cases where the GCD (M, N)=1 and where the GCD (M, N)≠1. In the second diagonal interleaving, upon input of the information bits $d_k$, the information input bits are stored in addresses old_addr [k] and the frame size k is determined, in step 631. A column and row parameter (M×N) for diagonal interleaving is determined in step 633. In step 635, second diagonal interleaving addresses are operated by $$\text{for } (j=0; j<M; j++) \text{ for } (i=0; i<N, i++) \text{ new addr}[i+j+N]=i+(M-1-(i+j) \mod M)*N \quad (2)$$

where and i and j increment frame location.

Following the designation of the addresses of the output buffer as in equation (2), the information bits stored in the input buffer are interleaved and stored in the output buffer.

The second diagonal interleaved output corresponding to an input sequence with M=6, N=5, and the GCD (M, N)=1 is shown in table 3.

TABLE 3

| input sequence (M = 6, N = 5) | | | | | interleaved sequence (M = 6, N = 5) | | | | |
|---|---|---|---|---|---|---|---|---|---|
| 0 | 1 | 2 | 3 | 4 | 25 | 21 | 17 | 13 | 9 |
| 5 | 6 | 7 | 8 | 9 | 20 | 16 | 12 | 8 | 4 |
| 10 | 11 | 12 | 13 | 14 | 15 | 11 | 7 | 3 | 29 |
| 15 | 16 | 17 | 18 | 19 | 10 | 6 | 2 | 28 | 24 |
| 20 | 21 | 22 | 23 | 24 | 5 | 1 | 27 | 23 | 19 |
| 25 | 26 | 27 | 28 | 29 | 0 | 26 | 22 | 18 | 14 |

In addition, an input sequence with M=6, N=6, and the GCD (M, N)≠1 is interleaved as shown in

TABLE 4

| input sequence (M = 6, N = 6) | | | | | | interleaved sequence (M = 6, N = 6) | | | | | |
|---|---|---|---|---|---|---|---|---|---|---|---|
| 0 | 1 | 2 | 3 | 4 | 5 | 30 | 25 | 20 | 15 | 10 | 5 |
| 6 | 7 | 8 | 9 | 10 | 11 | 24 | 29 | 14 | 9 | 4 | 35 |
| 12 | 13 | 14 | 15 | 16 | 17 | 18 | 13 | 8 | 3 | 34 | 29 |
| 18 | 19 | 20 | 21 | 22 | 23 | 12 | 7 | 2 | 33 | 28 | 23 |
| 24 | 25 | 26 | 27 | 28 | 29 | 6 | 1 | 32 | 27 | 22 | 17 |
| 30 | 31 | 32 | 33 | 34 | 35 | 0 | 31 | 26 | 21 | 16 | 11 |

In the third diagonal interleaving, the diagonal interleaving controller 517 can be implemented by $$\text{for } (j=0; j<M; j++) \text{ for } (i=0; i<N; i++) \text{ new addr}[i+j+N]=i+((i+j) \mod M)*N \quad (3)$$

An input sequence is stored at addresses of a mapped memory and then sequentially read by columns or rows by the diagonal interleaver 432. Otherwise, the input sequence is sequentially stored in the memory by columns or rows and read from an address bit by bit by the diagonal interleaver 432.

Deinterleaving is implemented in an order reverse to that of interleaving input data.

FIG. 10 is a flow chart of a first circular interleaving implemented by the circular shifting interleaver 434. The first circular shifting interleaving operation is a data reordering procedure in a predetermined interval, considering an input sequence as at least one circle. The first circular shifting interleaving operation can interleave an input sequence regardless of its length.

Referring to FIG. 10, input information bits $d_k$ are stored at addresses old_addr [k] of an input buffer, and frame size is determined in step 711. Parameters P and STEP are determined in step 713. Here, P is a hop interval parameter determining the performance of a circular shifting interleaver and thus empirically obtained to achieve an optimum effect. In addition, STEP is a parameter for shifting data from a location hopped by P to the left or right and has an integer value. Then, it is determined whether the GCD of P and SIZE is 1 in step 715. When the GCD (P, SIZE)=1, first circular shifting interleaving addresses are computed, in step 717, by $$\text{for } (i=0; i<\text{SIZE}; i++) \text{ new addr}[i]=(p*i+\text{STEP}) \mod \text{SIZE} \quad (4)$$

where i is a parameter representative of the frame size of the input data and less than the input data frame size, ranging from zero to SIZE, that is, the number of addresses, SIZE is a frame size, p is a natural number satisfying the GCD (SIZE, p)=1, and STEP is an integer and indicative of a starting point.

For example, the first circular shifting interleaved output, stored in new_addr[k] of the buffer, corresponding to an input sequence with SIZE=30 stored in new_addr[k] of the input buffer, that is, {0 1 2 3 4 5 6 7 8 9 10 11 12 13 14 15 16 17 18 19 20 21 22 23 24 25 26 27 28 29} is {0 11 22 3 14 25 6 17 28 9 20 1 12 23 4 15 26 7 18 29 10 21 2 13 24 5 16 27 8 19} if P=11 and STEP=0. The input sequence and the first circular shifting interleaved output sequence are tabulated as in

TABLE 5

| input sequence (M = 6, N = 5) | | | | | interleaved sequence (M = 6, N = 5, p = 11) | | | | |
|---|---|---|---|---|---|---|---|---|---|
| 0 | 1 | 2 | 3 | 4 | 0 | 11 | 22 | 3 | 14 |
| 5 | 6 | 7 | 8 | 9 | 25 | 6 | 17 | 28 | 9 |
| 10 | 11 | 12 | 13 | 14 | 20 | 1 | 12 | 23 | 4 |
| 15 | 16 | 17 | 18 | 19 | 15 | 26 | 7 | 18 | 29 |
| 20 | 21 | 22 | 23 | 24 | 10 | 21 | 2 | 13 | 24 |
| 25 | 26 | 27 | 28 | 29 | 5 | 16 | 27 | 8 | 19 |

However, with the GCD (SIZE, p)≠1 and p=6, the first circular shifting interleaving is not viable because the same data is overwritten.

Assuming that SIZE=30 for an input sequence stored in a sequential address old_addr[k] of an initial memory, P=11, and STEP=0, a corresponding interleaved output resulting from the first circular shifting interleaving of FIG. 10 is expressed in an M×N matrix as shown below.

TABLE 6

| input sequence (M = 6, N = 5) | | | | | interleaved sequence (M = 6, N = 5, p = 6) | | | | |
|---|---|---|---|---|---|---|---|---|---|
| 0 | 1 | 2 | 3 | 4 | 0 | 6 | 12 | 18 | 24 |
| 5 | 6 | 7 | 8 | 9 | 0 | 6 | 12 | 18 | 24 |
| 10 | 11 | 12 | 13 | 14 | 0 | 6 | 12 | 18 | 24 |
| 15 | 16 | 17 | 18 | 19 | 0 | 6 | 12 | 18 | 24 |
| 20 | 21 | 22 | 23 | 24 | 0 | 6 | 12 | 18 | 24 |
| 25 | 26 | 27 | 28 | 29 | 0 | 6 | 12 | 18 | 24 |

A second circular interleaving scheme includes enabling interleaving of the case with the GCD (SIZE, p)≠1, as shown in FIG. 11. The second circular shifting interleaving is a data reordering procedure in which an input sequence is viewed as a matrix of d×SIZE/d, rows are first circular shifting interleaved, and columns are block interleaved.

FIG. 11 is a flowchart of the second circular shifting interleaving which is applicable regardless of the GCD (SIZE, p)=1 or ≠1. In the second circular shifting interleaving operation, input information bits are stored in a sequential address old_addr[k] of a memory and frame size is determined, in step 721. Here, SIZE is a parameter indicative of the size of input data. Parameters P and STEP for circular shifting interleaving are determined in step 723. In step 725, second circular shifting interleaving addresses are achieved by equation (5):

$$d=GCD(P, \text{SIZE}); \text{ for } (k-j=0; j<d; j++) \text{ for } (\text{addr}[k]=((P*i+\text{STEP})+j) \bmod \text{SIZE} \quad (5)$$

where i and k are between 0 to SIZE, j is an address parameter, ranging from 0 to d, P is a hop parameter for implementing circular shifting interleaving, and STEP is a parameter determining a start point by shifting data placed in a location set by P to the left or right.

From equation (5), (P×i+STEP) represents a circular shifting interleaving operation and j indicates a block interleaving operation. SIZE is the size of the input data, p is a natural number, and STEP is an integer.

With SIZE=30 and p=11, a second circular shifting interleaved output is expressed in an M×N matrix as

TABLE 7

| input sequence (M = 6, N = 5) | | | | | interleaved sequence (M = 6, N = 5, p = 11) | | | | |
|---|---|---|---|---|---|---|---|---|---|
| 0 | 1 | 2 | 3 | 4 | 0 | 11 | 22 | 3 | 14 |
| 5 | 6 | 7 | 8 | 9 | 25 | 6 | 17 | 28 | 9 |
| 10 | 11 | 12 | 13 | 14 | 20 | 1 | 12 | 23 | 4 |
| 15 | 16 | 17 | 18 | 19 | 15 | 26 | 7 | 18 | 29 |
| 20 | 21 | 22 | 23 | 24 | 10 | 21 | 2 | 13 | 24 |
| 25 | 26 | 27 | 28 | 29 | 5 | 16 | 27 | 8 | 19 | which is the same as that of table 6. Yet, with the GCD (SIZE, p)≠1 and p=15,

TABLE 8

| input sequence (M = 6, N = 5) | | | | | interleaved sequence (M = 6, N = 5, p = 15) | | | | |
|---|---|---|---|---|---|---|---|---|---|
| 0 | 1 | 2 | 3 | 4 | 0 | 15 | 1 | 16 | 2 |
| 5 | 6 | 7 | 8 | 9 | 17 | 3 | 18 | 4 | 19 |
| 10 | 11 | 12 | 13 | 14 | 5 | 20 | 6 | 21 | 7 |
| 15 | 16 | 17 | 18 | 19 | 22 | 8 | 23 | 9 | 24 |
| 20 | 21 | 22 | 23 | 24 | 10 | 25 | 11 | 26 | 12 |
| 25 | 26 | 27 | 28 | 29 | 27 | 13 | 28 | 14 | 29 |

TABLE 8-continued

After the input sequence is stored at addresses of a mapped memory, the data is sequentially read by columns or rows by the circular shifting interleaver. Otherwise, the input sequence is sequentially stored in the memory by columns or rows and then read from the addresses bit by bit.

Deinterleaving can be implemented in an order reverse to that of interleaving input data.

Figure 12:
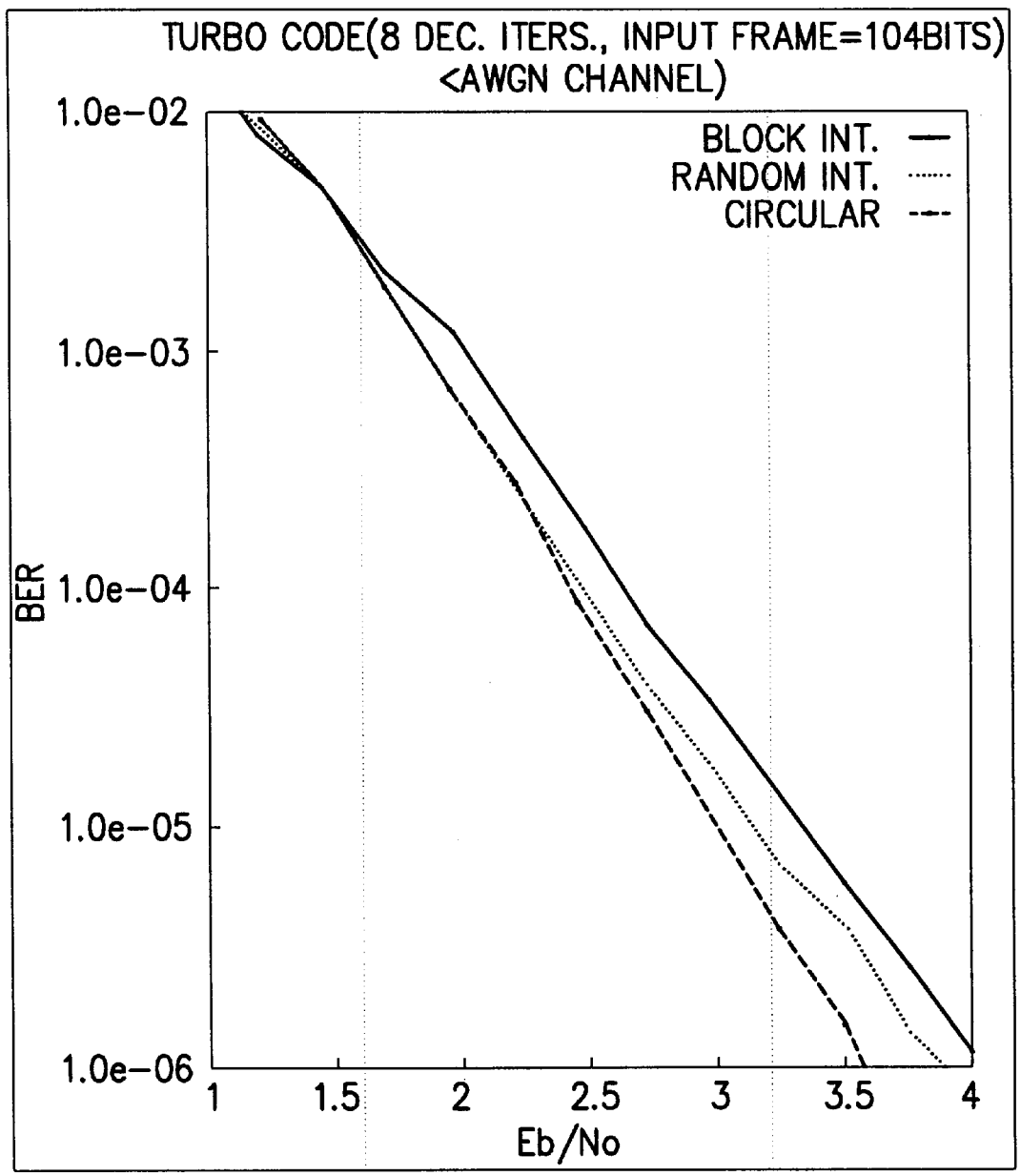
FIG. 12 is a graph showing characteristics of a turbo encoder relying on random and block interleavings versus those of the turbo encoder relying on circular shifting interleaving according to the second embodiment of the present invention.

FIG. 12 is a graph showing the performance of the circular shifting interleaver in a parallel concatenated turbo encoder according to the second embodiment of the present invention. Widely used block and random interleavers are compared with the circular shifting interleaver in terms of BER under the conditions of a component code with K=3, an input 104-bit frame, eight iterative decodings, BPSK (Bi-Phase Shift Key) modulation, and AWGN (Additive White Gaussian Noise). As is noted from FIG. 12, Eb/No of the circular shifting interleaver is 3 dB, while that of the block interleaver is 3.4 dB, under a $10^{-5}$ BER. Thus, it is inferred that the circular shifting interleaver is superior to the block interleaver in performance by about 0.4 dB.

Figure 13:
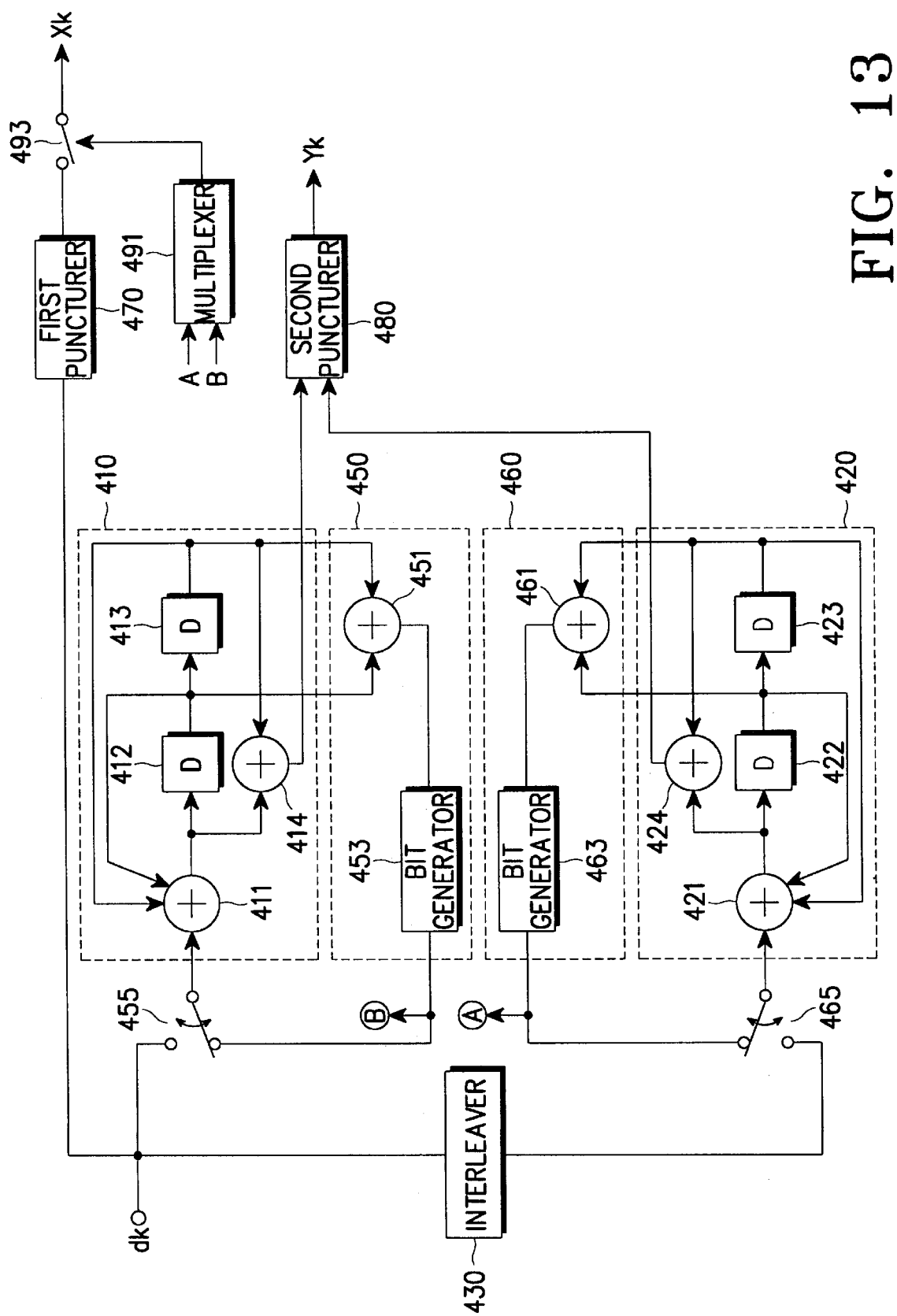
FIG. 13 is a block diagram of a turbo encoder according to the embodiments of the present invention, referred to for describing tail bit generation and puncturing.

FIG. 13 is a block diagram of a turbo encoder according to the embodiments of the present invention.

Referring to FIG. 13, the first component encoder 410 encodes input information bits with K=3, for example. The interleaver 430 interleaves the information bits in a predetermined method to thereby modify the order of the information bits. The interleaver 430 can be constituted as shown in FIG. 7. In this case, it may implement one of the first to third diagonal interleavings and the first to third circular shifting interleavings. The second component encoder 420 encodes the output of the interleaver 430 with K=3, for example.

A first tail bit generator 450 includes a first switch 455 connected to an input port of the first component encoder 410, an exclusive OR gate 451 for performing an exclusive OR operation on outputs of memories 412 and 413 of the first component encoder 410, and a bit generator 453 for generating a signal for terminating frames according to the output of the exclusive OR gate 451, and applying the signal to the first switch 455. In the first tail bit generator 450, the first switch 455 is connected to the first component encoder 410 upon termination of a frame and a frame termination signal is generated. A second tail bit generator 460 includes a second switch 465 connected to an input port of the second component encoder 420, an exclusive OR gate 461 for performing an exclusive OR operation on outputs of memory devices 422 and 423 of the second component encoder 420, and a bit generator 463 according to the output of the exclusive OR gate 461, generating a frame termination signal, and applying the signal to the second switch 465. In the second tail bit generator 460, the second switch 465 is connected to the second component encoder 420 upon termination of a frame and a frame termination signal is generated.

A first puncturer 470 punctures information bits. A second puncturer 480 punctures encoded data received from the first and second component encoders 410 and 420. The first and second puncturers 470 and 480 serve to adjust a data transmission rate. A multiplexer 491 multiplexes the outputs of the bit generators 453 and 463. A third switch 493 switches tail bits received from the multiplexer 491 to a transmission channel upon termination of a frame.

The first and second tail bit generators 450 and 460 generate tail bits for terminating the operations of the first and second component encoders 410 and 420, respectively. The first and second puncturers 470 and 480 function to adjust a transmission rate to an acceptable level.

Referring to FIG. 13, a turbo code has tail bits for terminating the component encoders 410 and 420. Here, since the component codes of the turbo code is systematic, the memories 412 and 413, and 422 and 423 of the component encoders 410 and 420 are not initialized even with input of consecutive zeroes as in a non-systematic convolutional code. To set values in a memory nearest to the input to zeroes, the first and second component encoders 410 and 420 input the sum of fed-back values to the memories by use of the tail bit generators. Therefore, the turbo encoder requires tail bits as many as memories of each component encoder. The first and second switches 455 and 465 are switched upon generation of tail bits. Then, parity bits generated from tail bits are applied from the first and second component encoders 410 and 420 to the second puncturer 480, and tail bits generated from the tail bit generators are switched by the third switch 493 to be output as information bits $X_k$.

It is desirable to set a transmission rate to a power of 2 in order to reduce hardware complexity. However, the 384 kbps transmission rate cannot be a power of 2 using a turbo code with a code rate of 1/2. In this case, the 1/2 turbo code is punctured to a 3/8 turbo code. Especially, in the case of 144 kbps, the 1/2 turbo code is punctured to be a 9/16 turbo code. 9/16 puncturing matrixes are exemplarily shown in

TABLE 9

| information bits | 1111111111111111 |
|---|---|
| RSC1 | 10010100101001 0010 |
| RSC2 | 0100100101001 01001 |

TABLE 10

| information bits | 1110111101111 0111 0 |
|---|---|
| RSC1 | 1010101010101010 |
| RSC2 | 0101010101010101 |

In tables 9 and 10, information bits are $d_k$, applied to the first puncturer 470, and RSC1 are parity bits applied from the first component encoder 410 to the second puncturer 480. Here, table 9 exemplarily shows puncturing of parity bits output from the component encoders 410 and 420. In this case, there are several consecutive zeroes corresponding to parity bits. That is, when the parity bits are punctured to adjust a transmission rate, zeroes successively appear as indicated by underlines in table 9. However, due to two memories in each of the component encoders 410 and 420, serious errors can be generated unless two or more parity bits are consecutively transmitted. Therefore, the information bits are punctured as shown in table 10 in the present invention. Table 10 shows a 9/16 puncturing matrix different from that of table 9 in that two or more parity bits are successively transmitted. Yet, the performance of the turbo code gets better as the number of iterative decodings increases.

According to the present invention as described above, a turbo code, which was unacceptable for voice and data transmission in a communication system due to time delay, can find its application in voice and data transmission with the introduction of an interleaver having a reduced size and showing excellent performance with respect to the turbo code in a turbo encoder. Furthermore, the interleaver having excellent performance reduces the state number of a component encoder in the turbo encoder, thereby decreasing the complexity of a decoder, in turn. Also, in accordance with one embodiment of the present invention as described above, a variety of encoding rates can be provided by puncturing the input information.

While the present invention has been described in detail with reference to the specific embodiments, they are mere exemplary applications. Thus, it is to be clearly understood that many variations can be made by one skilled in the art within the scope and spirit of the present invention as set forth by the appended claims.

What is claimed is:

1. A diagonal interleaving method comprising the steps of:

receiving variable input information;

determining the size of the variable input information outputting column and row values corresponding to the size of the variable input information; and diagonally interleaving information bits of the variable input information according to the column and row values.

2. The diagonal interleaving method of claim 1, wherein the diagonal interleaving is implemented on the basis of for ($k$=0; $k$<$M$*$N$−1; $k$++) new addr[$k$]=($M$−1−($k$ mod $N$))*$N$+($k$ mod $N$)

where M and N are the column and row values, M×N is the frame size, k is an index and new addr[ ] represents the new address of the diagonally interleaved information bits.

3. The diagonal interleaving method of claim 1, wherein the diagonal interleaving is implemented on the basis of for ($j$=0; $j$<$M$; $j$++) for ($i$=0; $i$<$N$; $i$++) new addr[$i$*$j$+$N$]=$i$+($M$−1−1($i$+$j$) mod $M$)*$N$ where M and N are the column and row values, M×N is the frame size, i and j are indexes and new addr[ ] represents the new address of the diagonally interleaved information bits.

4. The diagonal interleaving method of claim 1, wherein the diagonal interleaving is implemented on the basis of for ($j$=0; $j$<$M$; $j$++) for ($i$=0; $i$<$N$; $i$++) new addr[$i$*$j$+$N$]=$i$+(($i$+$j$) mod $M$)*$N$ where M and N are the column and row values, M×N is the frame size, i and j are indexes and new addr[ ] represents the new address of the diagonally interleaved information bits.

5. A circular shifting interleaving method, comprising the steps of:

receiving variable input information;

determining the size of the variable input information outputting hop and step parameters corresponding to the size of the variable input information; and performing a circular shifting interleaving on information bits of the variable input information according to the outputted hop and step parameters, using the information bits as at least one circle.

6. The circular shifting interleaving method of claim 5, wherein the circular shifting interleaving is implemented on the basis of for ($i$=0; $i$<SIZE; $i$++) new addr[$i$]=($p$*$i$+STEP) mod SIZE where SIZE is the size of data to be interleaved, p is the hop parameter for circular shifting interleaving, STEP is the step parameter having an integer value, for shifting data from a hopped position, new addr[ ] represents the new address of the interleaved information bits and i is an index.

7. The circular shifting interleaving method of claim 5, wherein the circular shifting interleaving is implemented on the basis of $$d=GCD(P, SIZE); \text{ for } (k-j=0; j<d; j++) \text{ for } (i=0; i<SIZE/d; i++, k++) \text{ new addr}[k]=((P\times i+STEP)+j) \text{ mod SIZE}$$

where SIZE is the size of data to be interleaved, p is the hop parameter for circular shifting interleaving, STEP is the step parameter having an integer value, for shifting data from a hopped position, new addr[ ] represents the new address of the interleaved information bits, GCD is the greatest common denominator and i, j and k are an indexes.

8. A turbo encoder comprising:
a plurality of component encoders for encoding variable input information bits; and
a diagonal interleaver connected to an input port of one of the component encoders and determining a size of the variable input information, for outputting column and row information corresponding to the size of the variable input information and diagonally interleaving the information bits.

9. The turbo encoder of claim 8, wherein the diagonal interleaver comprises:
a diagonal interleaving table for storing the column and row information corresponding to sizes of input information;
a diagonal interleaving controller for generating addresses to be used in diagonal interleaving of the information bits according to the column and row information, by $$\text{for } (k=0; k<M*N-1; k++) \text{ new addr}[k]=(M-1-(k \text{ mod } N))*N+(k \text{ mod } N)$$

where M and N are the column and row information, k is an index, new addr[ ] represents the new address of the interleaved information bits and M×N is a frame size; and
a memory for sequentially storing the input information bits and outputting the stored information bits according to the read addresses in a diagonal interleaving manner.

10. The turbo encoder of claim 8, wherein the diagonal interleaver comprises:
a diagonal interleaving table for storing the column and row information corresponding to sizes of input information;
a diagonal interleaving controller for generating addresses to be used in diagonal interleaving of the information bits according to the column and row information, by $$\text{for } (j=0; j<M; j++) \text{ for } (i=0; i<N, i++) \text{ new addr}[i+j+N]=i+(M-1(i+j) \text{ mod } M)*N$$

where M and N are the column and row information, new addr[ ] represents the new address of the interleaved information bits and i and j are indexes; and
a memory for sequentially storing the input information bits and outputting the stored information bits according to the read addresses in a diagonal interleaving manner.

11. The turbo encoder of claim 8, wherein the diagonal interleaver comprises:
a diagonal interleaving table for storing the column and row information corresponding to sizes of input information;
a diagonal interleaving controller for generating addresses to be used in diagonal interleaving of the information bits according to the column and row information, by $$\text{for } (j=0; j<M; j++) \text{ for } ( i=0; i<N; i++) \text{ new addr}[i+j+N]=i+((i+j) \text{ mod } M)*N$$

where M and N are the column and row information, new addr[ ] represents the new address of the interleaved information bits and i and j are indexes; and
a memory for sequentially storing the input information bits and outputting the stored information bits according to the read addresses in a diagonal interleaving manner.

12. A turbo encoder comprising:
a plurality of component encoders for encoding bits of variable input information; and
a circular shifting interleaver connected to an input port of one of the component encoders and determining size of the variable input information, for outputting hop and step information corresponding to the size of the variable input information and performing a circular shifting interleaving on the information bits.

13. The turbo encoder of claim 12, wherein the circular shifting interleaver comprises:
a circular shifting interleaving table for storing the hop and step information corresponding to sizes of an input frame;
a circular shifting interleaving controller for generating addresses to be used in circular shifting interleaving of the information bits of the frame according to the hop and step information, by $$\text{for } (i=0; i<SIZE; i++) \text{ new addr}[i]=(p*i+STEP) \text{ mod SIZE}$$

where SIZE is the size of data to be interleaved, p is a hop parameter for circular shifting interleaving, new addr[ ] represents the new address of the interleaved information bits, STEP is a step parameter being an integer, for shifting data from a hopped position and i is an index; and
a memory for sequentially storing the input information bits and outputting the stored information bits according to the read addresses in a circular shifting interleaving manner.

14. The turbo encoder of claim 12, wherein the circular shifting interleaver comprises:
a circular shifting interleaving table for storing the hop and step information corresponding to sizes of an input frame; and
a circular shifting interleaving controller for generating addresses to be used in circular shifting interleaving of the information bits of the frame according to the hop and step information, by $$d=GCD(P, SIZE); \text{ for } (k-j=0; j<d; j++) \text{ for } (i=0; i<SIZE/d; i++, k++) \text{ new addr}[k]=((P*i+STEP)+j) \text{ mod SIZE}$$

where SIZE is the size of frame data, p is a hop parameter for circular shifting interleaving, and i, j and k are indexes, new addr[ ] represents the new address of the interleaved information bits, GCD is a greatest common denominator and STEP is a step parameter being an integer, for shifting data from a hopped position.

15. A turbo encoder comprising:
a plurality of component encoders for encoding input information bits;
an interleaver connected to an input port of one of the component encoders, for interleaving the information bits;

as many tail bit generators as the component encoders, for generating tail bits as a frame termination signal for terminating the frame of the input information bits;

a first puncturer for puncturing the input information bits; and a second puncturer for puncturing output of the component encoders.

16. The turbo encoder as recited in claim 15, wherein the interleaver includes a diagonal interleaver.

17. The turbo encoder as recited in claim 15, wherein the interleaver includes a circular shift interleaver.

18. A circular shifting interleaving method, comprising the steps of:

receiving a signal representative of variable input information;

determining the size of the variable input information;

outputting hop parameters corresponding to the size of the variable input information; and performing a circular shifting interleaving on input information bits according to the outputted hop parameter, using the information bits as at least one circle.

19. The circular shifting interleaving method of claim 18, wherein the circular shifting interleaving is implemented on the basis of $$\text{for } (i=0; i<\text{SIZE}; i++) \text{ new addr}[i]=(p*i+\text{STEP}) \text{ mod SIZE}$$

where SIZE is the size of input information to be interleaved, p is the hop parameter for circular shifting interleaving, STEP is the step parameter having an integer value, for shifting data from a hopped position, new addr[ ] represents the new address of the interleaved information bits and i is an index.

20. The circular shifting interleaving method of claim 18, wherein the circular shifting interleaving is implemented on the basis of $$d=\text{GCD}(P, \text{SIZE}); \text{ for } (k-j=0; j<d; j++) \text{ for } (i=0; i<\text{SIZE}/d; i++, k++) \text{ new addr}[k]=((P\times i+\text{STEP})+j) \text{ mod SIZE}$$

where SIZE is the size of input information to be interleaved, p is the hop parameter for circular shifting interleaving, new addr[ ] represents the new address of the interleaved information bits, GCD is a greatest common denominator, i, j and k are indexes and STEP is the step parameter having an integer value, for shifting data from a hopped position.

21. A turbo encoder comprising:

a plurality of component encoders for encoding variable input information bits; and a circular shifting interleaver connected to an input port of one of the component encoders and determining the size of the variable input information to be interleaved, for outputting a hop parameter corresponding to the size of the variable input information and performing a circular shifting interleaving on the variable information bits.

22. The turbo encoder of claim 21, wherein the circular shifting interleaver comprises:

a circular shifting interleaving table for storing a hop parameter corresponding to the size of input information to be interleaved; and a circular shifting interleaving controller for generating addresses to be used in circular shifting interleaving of the input information bits according to the hop parameter, by $$\text{for } (i=0; i<\text{SIZE}; i++) \text{ new addr}[i]=(p*i+\text{STEP}) \text{ mod SIZE}$$

where SIZE is the size of input information to be interleaved, p is the hop parameter for circular shifting interleaving, new addr[ ] represents the new address of the interleaved information bits, i is and index and STEP is a step parameter being an integer, for shifting date from a hopped position.

23. The turbo encoder of claim 22, wherein the circular shifting interleaver comprises:

a circular shifting interleaving table for storing a hop parameter corresponding to the size of input information to be interleaved; and a circular shifting interleaving controller for generating addresses to be used in circular shifting interleaving of the input information bits according to the hop parameter, by $$d=\text{GCD}(P, \text{SIZE}); \text{ for } (k-j=0; j<d; j++) \text{ for } (i=0; i<\text{SIZE}/d; i++, k++) \text{ new addr}[k]=((P\times i+\text{STEP})+j) \text{ mod SIZE}$$

where SIZE is the size of input information to be interleaved, p is a hop parameter for circular shifting interleaving, STEP is a step parameter being an integer, for shifting data from a hopped position, new addr[ ] represents the new address of the interleaved information bits, GCD is the greatest common denominator and i, j, and k are indexes.

24. A turbo encoder comprising:

a plurality of component encoders for encoding input information bits;

an interleaver connected to an input port of one of the component encoders, for interleaving the input information bits;

a first puncturer for puncturing the input information bits; and a second puncturer for puncturing the output of the component encoders to control a data transmission rate.

25. A channel encoding method for use in a channel encoder having a first component encoder and a second component encoder, comprising the steps of:

outputting variable input information;

generating a first parity of the input information by the first component encoder;

diagonally interleaving the input information in a matrix of columns and rows corresponding to the variable frame size of the input information; and generating a second parity of the interleaved input information by the second component encoder.

26. The channel encoding method of claim 25, wherein the diagonal interleaving is implemented on the basis of $$\text{for } (k=0; k<M*N-1; k++) \text{ new addr}[k]=(M-1-(k \text{ mod } N))*N+(k \text{ mod } N)$$

where M and N are column and row values, M×N is a frame size, new addr[ ] represents the new address of the interleaved information bits and k is an index.

27. The channel encoding method of claim 25, wherein the diagonal interleaving is implemented on the basis of $$\text{for } (j=0; j<M; j++) \text{ for } (i=0; i<N; i++) \text{ new addr}[i+j+N]=i+(M-1-(i+j) \text{ mod } M)*N$$

where M and N are column and row values, M×N is a frame size, new addr[ ] represents the new address of the interleaved information bits and i and j are indexes.

28. The channel encoding method of claim 25, wherein the diagonal interleaving is implemented on the basis of $$\text{for } (j=0; j<M; j++) \text{ for } (i=0; i<N; i++) \text{ new addr}[i+j+N]=i+((i+j) \bmod M)*N$$

where M and N are column and row values, M×N is a frame size, new addr[ ] represents the new address of the interleaved information bits and i and j are indexes.

29. A channel encoding method for use in a channel encoder having a first component encoder and a second component encoder, comprising the steps of:
outputting variable input information;
generating a first parity of the variable input information by the first component encoder;
performing a circular shifting interleaving on the variable input information; and
generating a second parity of the interleaved input information by the second component encoder.

30. The channel encoding method of claim 29, wherein the circular shifting interleaving is implemented according to a hop parameter corresponding to the size of the variable input information.

31. The channel encoding method of claim 30, wherein the size of the input information and the hop parameter corresponding to the size of the variable input information are stored.

32. The channel encoding method of claim 29, wherein the circular shifting interleaving is implemented according to a hop parameter corresponding to the size of the variable input information and the order in which the variable input information bits are arranged.

33. The channel encoding method of claim 32, wherein the circular shifting interleaving is implemented, using a remnant obtained by dividing the product of the hop parameter and the order information of the variable input information bits by a circle size.

34. The channel encoding method of claim 33, wherein the circular shifting interleaving is implemented on the basis of $$\text{for } (i=0; i<\text{SIZE}; i++) \text{ new addr}[i]=(p*i+\text{STEP}) \bmod \text{SIZE}$$

where i is the order of the input information bits, p is the hop parameter for circular shifting interleaving, STEP is a starting position including zero, new addr[ ] represents the new address of the interleaved information bits and SIZE is a circle size.

35. The channel encoding method of claim 34, wherein the circle size is equal to the size of the variable input information.

36. The channel encoding method of claim 33, wherein the circular shifting interleaving is implemented on the basis of $$d=GCD(P, \text{SIZE}); \text{ for } (k-j=0; j<d; j++) \text{ for } (i=0; i<\text{SIZE}/d; i++, k++) \text{ new addr}[k]=((P \times i+\text{STEP})+j) \bmod \text{SIZE}$$

where SIZE is a circle size, p is the hop parameter for circular shifting interleaving, STEP is a starting position including zero, GCD is the greatest common denominator, new addr[ ] represents the new address of the interleaved information bits and i and j are indexes.

37. A channel encoding method for use in a channel encoder having a first component encoder and a second component encoder, comprising the steps of:
outputting variable input information;
generating a first parity of the variable input information by the first component encoder;
interleaving the variable input information;
generating a second parity of the interleaved input information by the second component encoder; and
puncturing the variable input information which was output.

38. The channel encoding method of claim 37, wherein the first and second parities are further punctured.

39. The channel encoding method of claim 37, wherein the interleaving is a circular shifting interleaving.

40. The channel encoding method of claim 39, wherein the circular shifting interleaving is implemented according to a hop parameter corresponding to the size of the variable input information.

41. The channel encoding method of claim 40, wherein the size of the variable input information and the hop parameter corresponding to the size of the variable input information are stored.

42. The channel encoding method of claim 39, wherein the circular shifting interleaving is implemented according to a hop parameter corresponding to the size of the variable input information and the order in which the variable input information bits are arranged.

43. The channel encoding method of claim 42, wherein the circular shifting interleaving is implemented, using a remnant obtained by dividing the product of the hop parameter and the information on the order of the variable input information bits by a circle size.

44. The channel encoding method of claim 43, wherein the circular shifting interleaving is implemented on the basis of $$\text{for } (i=0; i<\text{SIZE}; i++) \text{ new addr}[i]=(p*i+\text{STEP}) \bmod \text{SIZE}$$

where i is the order of the input information bits, p is the hop parameter for circular shifting interleaving, STEP is a starting position including zero, new addr[ ] represents the new address of the interleaved information bits and SIZE is a circle size.

45. The channel encoding method of claim 44, wherein the circle size is equal to the size of the variable input information.

46. The channel encoding method of claim 43, wherein the circular shifting interleaving is implemented on the basis of $$d=GCD(P, \text{SIZE}); \text{ for } (k-j=0; j<d; j++) \text{ for } (i=0; i<\text{SIZE}/d; i++, k++) \text{ new addr}[k]=((P*i+\text{STEP})+j) \bmod \text{SIZE}$$

where SIZE is the size of the input information to be interleaved, p is the hop parameter for circular shifting interleaving, STEP is a starting position including zero, GCD is a greatest common denominator, new addr[ ] represents the new address of the interleaved information bits and i, j, and k are indexes.

47. The channel encoding method of claim 37, wherein a portion of the input information, the first parity and the second parity are punctured in the puncturing step.

48. The channel encoding method of claim 47, wherein a portion of the first parity, and the second parity are punctured in the puncturing step.

49. The channel encoding method of claim 47, wherein neither the first parity nor the second parity is punctured in the puncturing step.

50. A channel encoding method for use in a channel encoder having a first component encoder and a second component encoder, comprising the steps of:
outputting variable input information;
generating a first parity of the variable input information by the first component encoder;

interleaving the variable input information;
generating a second parity of the interleaved input information by the second component encoder; and
generating tail bits for terminating memories in the first and second component encoders.

51. A channel encoding device comprising:
a first component encoder for encoding variable input information and generating a first parity;
an interleaver for interleaving the variable input information;
a second component encoder for encoding the interleaved information and generating a second parity; and
a controller for controlling the interleaver to perform a diagonal interleaving.

52. The channel encoding device of claim 51, wherein the interleaver diagonally interleaves the variable input information in a matrix of columns and rows corresponding to the size of the variable input information.

53. The channel encoding device of claim 52, wherein the diagonal interleaving is implemented on the basis of $$\text{for } (k=0; k<M*N-1; k++) \text{ new addr}[k]=(M-1-(k \bmod N))*N+(k \bmod N)$$

where M and N are column and row values, M×N is a frame size, new addr[ ] represents the new address of the interleaved information bits and k is an index.

54. The channel encoding device of claim 52, wherein the diagonal interleaving is implemented on the basis of $$\text{for } (j=0; j<M; j++) \text{ for } (i=0; i<N; i++) \text{ new addr}[i+j+N]=i+(M-1-(i+j) \bmod M)*N$$

where M and N are column and row values, M×N is a frame size, GCD is the greatest common denominator, new addr[ ] represents the new address of the interleaved information bits and i and j are indexes.

55. The channel encoding device of claim 52, wherein the diagonal interleaving is implemented on the basis of $$\text{for } (j=0; j<M; j++) \text{ for } (i=0; i<N; i++) \text{ new addr}[i+j+N]=i+((i+j) \bmod M)*N$$

where M and N are column and row values, M×N is a frame size, new addr[ ] represents the new address of the interleaved information bits and i and j are indexes.

56. A channel encoding device comprising:
a first component encoder for encoding variable input information and generating a first parity;
an interleaver for performing a circular shifting interleaving on the variable input information; and
a second component encoder for encoding the interleaved information and generating a second parity.

57. The channel encoding device of claim 56, wherein the circular shifting interleaving is implemented according to a hop parameter corresponding to the size of the variable input information.

58. The channel encoding device of claim 57, wherein the size of the variable input information and the hop parameter corresponding to the size of the variable input information are stored.

59. The channel encoding device of claim 56, wherein the circular shifting interleaving is further implemented according to a hop parameter corresponding to the size of the variable input information and the order in which the input information bits are arranged.

60. The channel encoding device of claim 59, wherein the circular shifting interleaving is implemented, using a remnant obtained by dividing the product of the hop parameter and the information on the order of the variable input information bits by a circle size.

61. The channel encoding device of claim 60, wherein the circular shifting interleaving is implemented on the basis of $$\text{for } (i=0; i<\text{SIZE}; i++) \text{ new addr}[i]=(p*i+\text{STEP}) \bmod \text{SIZE}$$

where i is the order of the input information bits, p is the hop parameter of circular shifting interleaving, STEP is a starting position including zero, new addr[ ] represents the new address of the interleaved information bits and SIZE is a circle size.

62. The channel encoding device of claim 61, wherein the circle size is equal to the size of the variable input information.

63. The channel encoding device of claim 60, wherein the circular shifting interleaving is implemented on the basis of $$d=GCD(P, \text{SIZE}); \text{ for } (k-j=0; j<d; j++) \text{ for } (i=0; i<\text{SIZE}/d; i++, k++) \text{ new addr}[k]=((P*i+\text{STEP})+j) \bmod \text{SIZE}$$

where SIZE is the circle size, p is the hop parameter of circular shifting interleaving, STEP is a starting position including zero, GCD is the greatest common denominator, new addr[ ] represents the new address of the interleaved information bits and i, j, and k are indexes.

64. A channel encoding device comprising:
means for outputting variable input information;
a first component encoder for encoding the variable input information and generating a first parity;
an interleaver for interleaving the variable input information;
a second component encoder for encoding the interleaved information and generating a second parity; and
a puncturer for the output of the output means.

65. The channel encoding device of claim 64, further comprising a second puncturer for puncturing the first and second parities.

66. The channel encoding device of claim 65, wherein one of the data elements selected from the input information and the parities is punctured selectively.

67. The channel encoding device of claim 65, wherein a portion of the input information, the first parity, and the second parity are punctured.

68. The channel encoding method of claim 67, wherein one of the parities is punctured.

69. The channel encoding device of claim 64, wherein the interleaver is a circular shifting interleaver.

70. The channel encoding device of claim 64, wherein the interleaver performs a circular shifting interleaving according to a hop parameter corresponding to the size of variable input information.

71. The channel encoding device of claim 70, wherein the interleaver has means for storing the size of the variable input information and hop parameter corresponding to the input information size.

72. The channel encoding device of claim 70, wherein the interleaver performs a circular shifting on the basis of the hop parameter corresponding to the size of the variable input information and the order of the variable input information.

73. The channel encoding device of claim 72, wherein the circular shifting interleaving is implemented, using a remnant obtained by dividing the product of the hop parameter and the information on the order of the variable input information bits by a circle size.

74. The channel encoding device of claim 73, wherein the circular shifting interleaving is implemented on the basis of for (i=0; i<SIZE; i++) new addr[i]=(p*i+STEP) mod SIZE where i is the order of the input information bits, p is the hop parameter for circular shifting interleaving, STEP is a starting position including zero, new addr[ ] represents the new address of the interleaved information bits and SIZE is a circle size.

75. The channel encoding device of claim 74, wherein the circle size is equal to the size of the variable input information.

76. The channel encoding device of claim 73, wherein the circular shifting interleaving is implemented on the basis of d=GCD(P, SIZE); for (k=j=0; j<d; j++) for (i=0; i<SIZE/d; i++, k++) new addr[k]=((P×i+STEP)+j) mod SIZE where SIZE is the circle size, p is the hop parameter for circular shifting interleaving, STEP is a starting position including zero, GCD is a greatest common denominator, new addr[ ] represents the new address of the interleaved information bits and i, j, and k are indexes.

77. A channel encoding method for use in a channel encoder having a plurality of encoders, comprising the steps of:

receiving variable input information;

determining a method of interleaving for performing an optimum interleaving on the input information from among two or more interleaving methods; and interleaving the input information according to the determined interleaving method.

78. A channel encoding method for use in a channel encoder having a first component encoder and a second component encoder, comprising the steps of:

outputting variable input information;

generating a first parity of the variable input information by the first component encoder;

interleaving the variable input information;

generating a second parity of the variable input information by the second component encoder; and puncturing the first and second parity bits which were output.

79. A channel encoding device comprising:

means for outputting variable input information;

a first component encoder for encoding the input variable information and generating a first parity;

an interleaver for interleaving the variable input information;

a second component encoder for encoding the interleaved information and generating a second parity; and a puncturer for the output of the first and second component encoders.

80. A turbo encoder comprising:

a plurality of component encoders for encoding variable input information;

an interleaver connected to an input port of one of the component encoders, for interleaving the input information; and tail bit generators generating tail bits for initializing the encoders and terminating the variable input information.

81. A channel encoding method for use in a channel encoder having a first component encoder and a second component encoder, comprising the steps of:

outputting variable input information;

generating a first parity of the variable input information by the first component encoder;

interleaving the variable input information;

generating a second parity of the interleaved input information by the second component encoder; and generating first tail bits for initializing memories in the first component and second tail bits for initializing memories in the second component.

82. A channel encoding method of claim 81, wherein the first and second tail bits are multiplexed and transmitted for terminating the variable input information.

* * * * *

UNITED STATES PATENT AND TRADEMARK OFFICE
CERTIFICATE OF CORRECTION

PATENT NO. : 6,289,486 B1
DATED : September 11, 2001
INVENTOR(S) : Phil-Joong Lee, Young Kim, Chang-Soo Park, Hyeon-Woo Lee and Jun-Jin Kong It is certified that error appears in the above-identified patent and that said Letters Patent is hereby corrected as shown below:

<u>Title page,</u>
Item [30], Foreign Application Priority Data,
"July 30, 1997 (KR) ............................ 97-36365" should be
-- July 30, 1997 (KR)................................. 97-36265 --.

Signed and Sealed this

Fourteenth Day of May, 2002

Attest:

Attesting Officer

JAMES E. ROGAN
*Director of the United States Patent and Trademark Office*